United States Patent
Chi et al.

(10) Patent No.: US 11,362,007 B2
(45) Date of Patent: Jun. 14, 2022

(54) FIN HEIGHT MONITORING STRUCTURE AND FIN HEIGHT MONITORING METHOD

(71) Applicant: Winbond Electronics Corp., Taichung (TW)

(72) Inventors: Wan-Yun Chi, Taichung (TW); Yi-Chun Chin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/748,733

(22) Filed: Jan. 21, 2020

(65) Prior Publication Data

US 2021/0225714 A1    Jul. 22, 2021

(51) Int. Cl.
*H01L 21/66* (2006.01)
*H01L 21/822* (2006.01)
*H01L 21/76* (2006.01)

(52) U.S. Cl.
CPC ............. *H01L 22/12* (2013.01); *H01L 21/76* (2013.01); *H01L 21/822* (2013.01); *H01L 22/14* (2013.01); *H01L 22/34* (2013.01)

(58) Field of Classification Search
None
See application file for complete search history.

(56) References Cited

U.S. PATENT DOCUMENTS

| | | |
|---|---|---|
| 2005/0183282 A1 | 8/2005 | Watanabe et al. |
| 2007/0184565 A1 | 8/2007 | Park et al. |
| 2007/0290253 A1 | 12/2007 | Kito et al. |
| 2013/0228778 A1* | 9/2013 | Tsai ............... G01B 7/082 257/48 |
| 2018/0175045 A1* | 6/2018 | Lee ............... G11C 11/4091 |
| 2019/0019760 A1* | 1/2019 | Peng ............... H01L 23/544 |
| 2019/0067294 A1* | 2/2019 | Lee ............... H01L 27/10885 |
| 2019/0131445 A1 | 5/2019 | Liu |
| 2021/0159129 A1* | 5/2021 | Lin ............... H01L 29/788 |

* cited by examiner

Primary Examiner — Alexander G Ghyka
(74) Attorney, Agent, or Firm — JCIPRNET

(57) ABSTRACT

A fin height monitoring structure including a substrate, isolation structures, a first word line, and a second word line is provided. The substrate includes a first region and a second region. The isolation structures are located in the substrate of the first region to define at least one active area. The substrate in the active area has a fin that is higher than the isolation structures. The first word line is located on the isolation structures of the first region and on the fin of the first region. The second word line is located on the substrate of the second region.

18 Claims, 3 Drawing Sheets

FIN HEIGHT MONITORING STRUCTURE AND FIN HEIGHT MONITORING METHOD

BACKGROUND

Technical Field

The disclosure relates to a monitoring structure of a semiconductor device and a monitoring method of the semiconductor device, and more particularly, to a fin height monitoring structure and a fin height monitoring method.

Description of Related Art

The fin height of a semiconductor has a great influence on the threshold voltage.

Therefore, the change in the fin height must be monitored during the manufacturing process. However, the current fin height monitoring methods cannot effectively and real-timely monitor the fin height and often need related tools such as physical failure analysis (PFA) for verification and quantification, causing the progress of improving the manufacturing process to be slowed.

SUMMARY

The disclosure provides a fin height monitoring structure and a fin height monitoring method that can effectively and real-timely monitor the fin height.

The disclosure provides a fin height monitoring structure which includes a substrate, a plurality of isolation structures, a first word line and a second word line. The substrate includes a first region and a second region. The isolation structures are located in the substrate of the first region to define at least one active area. The substrate in the active area has a fin higher than the isolation structures. The first word line is located on the isolation structures of the first region and on the fin of the first region. The second word line is located on the substrate of the second region.

The disclosure provides a fin height monitoring method which includes the following steps: providing the fin height monitoring structure as described above; measuring a first resistance value of the first word line; measuring a second resistance value of the second word line; and monitoring a height of the fin by the first resistance value and the second resistance value.

Based on the above, in the fin height monitoring structure and the fin height monitoring method provided in the disclosure, the first word line is located on the isolation structures of the first region and on the fin of the substrate, so the first resistance value of the first word line is affected both by the distance from the top of the first word line to the top of the isolation structures and by the distance from the top of the first word line to the top of the substrate. In addition, the second word line is located on the substrate in the second region, so the second resistance value of the second word line is affected only by the distance from the top of the second word line to the top of the substrate. In this way, the height of the fin can be monitored by the relativity between the first resistance value and the second resistance value, whereby the height of the fin can be effectively and real-timely monitored.

In order to make the aforementioned features and advantages of the disclosure comprehensible, embodiments accompanied with drawings are described in detail below.

DESCRIPTION OF THE EMBODIMENTS

Figure 1:
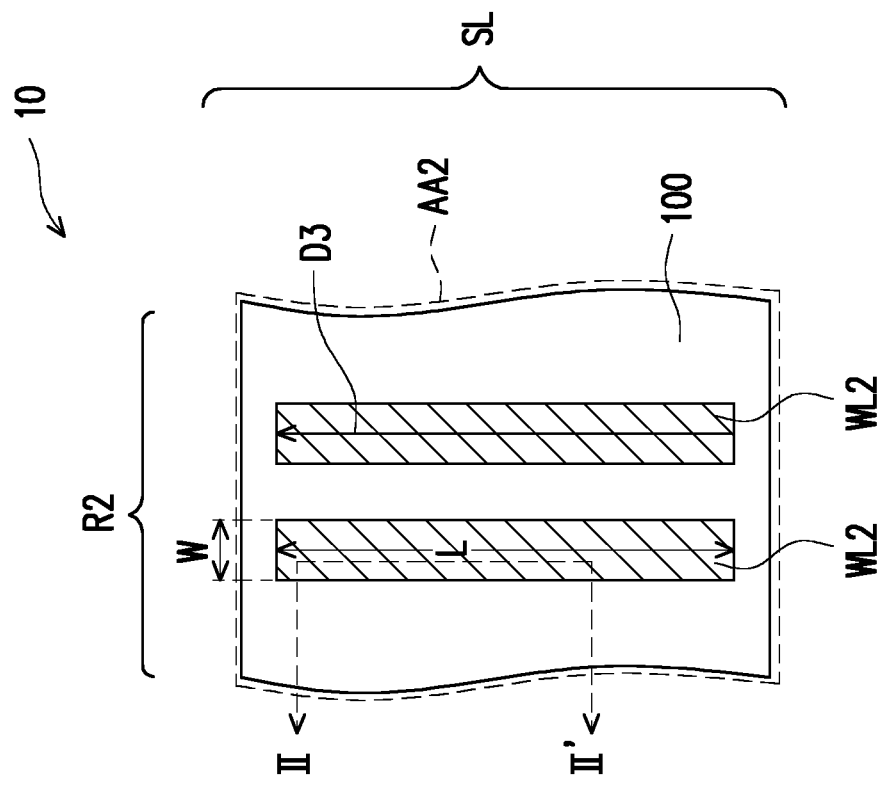
FIG. 1 is a top view of a fin height monitoring structure according to an embodiment of the disclosure.
Figure 1:
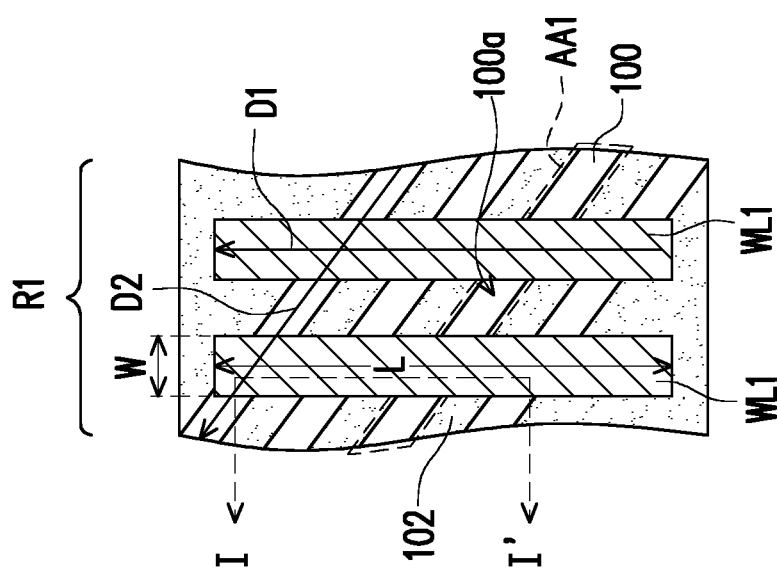
Figure 2:
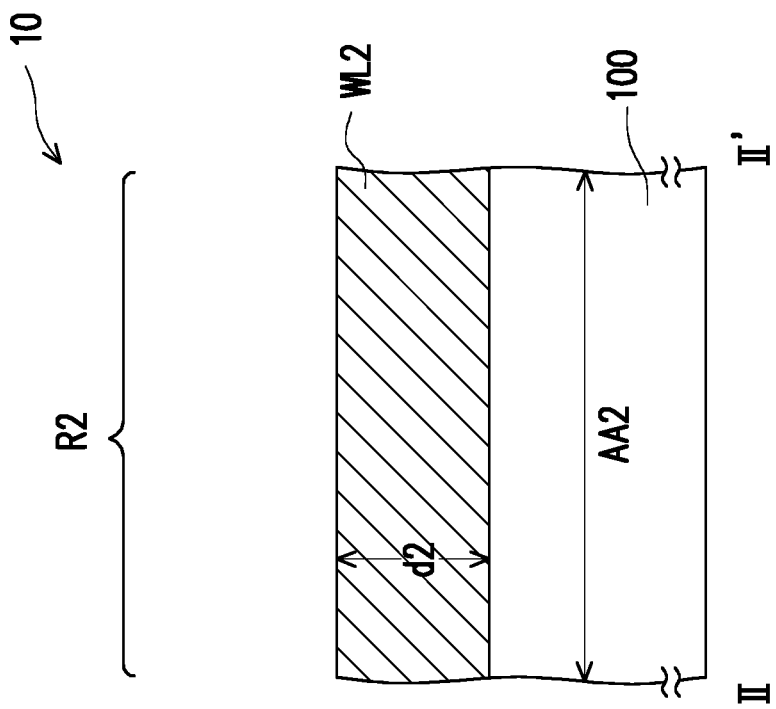
FIG. 2 is a cross-sectional view taken along the line I-I' and the line II-IF in FIG. 1.
Figure 2:
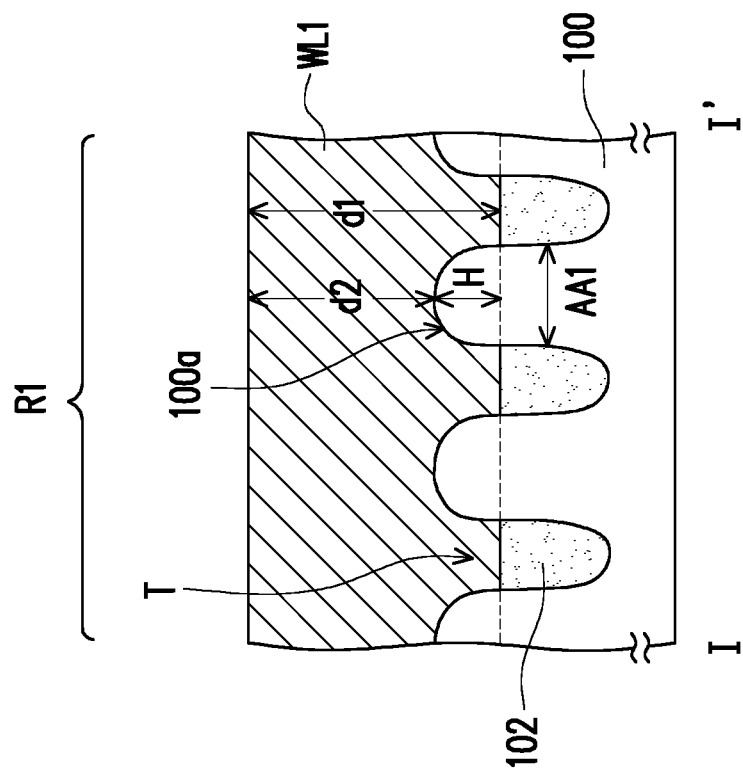

With reference to FIG. 1 and FIG. 2, a fin height monitoring structure 10 includes a substrate 100, a plurality of isolation structures 102, a word line WL1, and a word line WL2. The substrate 100 includes a first region R1 and a second region R2. A plurality of trenches T may be located in the substrate 100 of the first region R1. The substrate 100 is, for example, a semiconductor substrate 100 such as a silicon substrate. The first region R1 and the second region R2 may be located on a scribe line SL of a wafer. The first region R1 may have the same structure as an element region (e.g., a memory cell region).

The isolation structures 102 are located in the substrate 100 of the first region R1 to define at least one active area AA1. In the embodiment, the isolation structures 102 are located only in the first region R1, for example. That is, the isolation structures 102 are not located in the second region R2. The isolation structures 102 may be located in the trenches T. In addition, the isolation structures 102 and the active area AA1 may be alternately arranged. The material of the isolation structures 102 is, for example, silicon oxide.

The substrate 100 in the active area AA1 has a fin 100a that is higher than the isolation structures 102. The fin 100a has a height H. The height H may be set as a distance between the top of the fin 100a and the top of the isolation structures 102.

The word line WL1 is located on the isolation structures 102 of the first region R1 and on the fin 100a of the first region R1. That is, the word line WL1 may extend above the isolation structures 102 and the fin 100a of the first region R1. A part of the word line WL1 may be located in the trenches T. In the embodiment, the word line WL1 may be a buried word line. An extending direction D1 of the word line WL1 may intersect an extending direction D2 of the fin 100a. In FIG. 1, the included angle between the extending direction D1 and the extending direction D2 is merely an example, and the disclosure is not limited thereto. One of ordinary skill in the art can adjust the included angle between the extending direction D1 and the extending direction D2 according to the product design. In addition, a distance d1 from the top of the word line WL1 to the top of the isolation structures 102 may be greater than a distance d2 from the top of the word line WL1 to the top of the substrate 100 (i.e., the top of the fin 100a). The material of the word line WL1 may be a conductive material, such as a metal (e.g., tungsten or aluminum).

The word line WL2 is located on the substrate 100 of the second region R2. In the embodiment, the substrate 100 in the second region R2 may be regarded as an active area AA2. Since the isolation structures 102 are located only in the first region R1, the word line WL2 is not located on the isolation structures 102. The word line WL1 and the word line WL2 may have a same length L and a same width W. In addition, a distance from the top of the word line WL2 to the top of the substrate 100 may be substantially equal to a distance from the top of the word line WL1 to the top of the substrate 100, that is, the distance d2. An extending direction D3 of the word line WL2 may be parallel to the extending direction D1 of the word line WL1. The word line WL1 and the word line WL2 may be made of the same material. The material of the word line WL2 may be a conductive material, such as a metal (e.g., tungsten or aluminum).

In addition, the fin height monitoring structure 10 may further include a dielectric layer (not shown) disposed between the word line WL1 and the substrate 100 and between the word line WL2 and the substrate 100, whereby the word line WL1 may be isolated from the substrate 100, and the word line WL2 may be isolated from the substrate 100. Since the above-mentioned dielectric layer has little influence on the fin height monitoring method, its description is omitted here.

Based on the above, in the fin height monitoring structure 10 of the above embodiment, the word line WL1 is located on the isolation structures 102 of the first region R1 and on the fin 100a of the substrate 100, so the resistance value of the word line WL1 is affected both by the distance d1 from the top of the word line WL1 to the top of the isolation structures 102 and by the distance d2 from the top of the word line WL1 to the top of the substrate 100. In addition, the word line WL2 is located on the substrate 100 in the second region R2, so the resistance value of the word line WL2 is affected only by the distance d2 from the top of the word line WL2 to the top of the substrate 100. In this way, the height of the fin 100a can be monitored by the relativity between the resistance value of the word line WL1 and the resistance value of the word line WL2, whereby the height of the fin 100a can be effectively and real-timely monitored.

Figure 3:
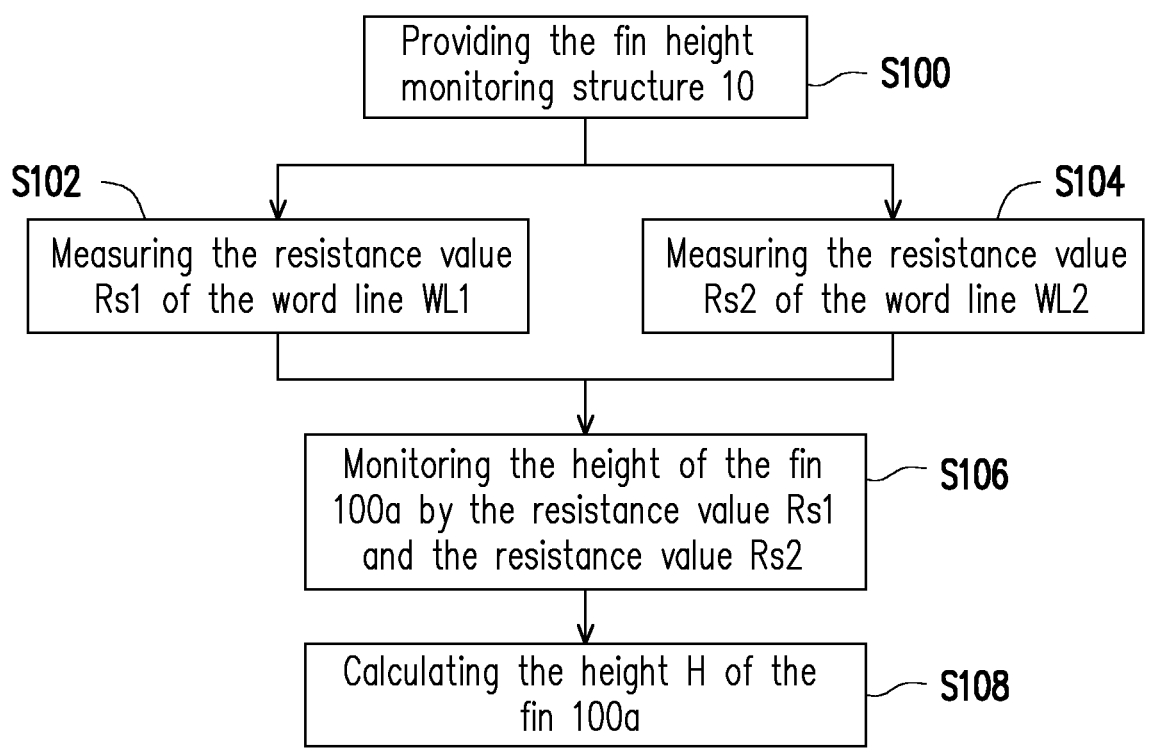
FIG. 3 is a flowchart of a fin height monitoring method according to an embodiment of the disclosure.

With reference to all of FIG. 1 to FIG. 3, step S100 is performed to provide the fin height monitoring structure 10. The materials, disposition methods, and functions of the components in the fin height monitoring structure 10 have been described in detail in the above embodiments and will not be repeated here.

Next, step S102 is performed to measure the resistance value Rs1 of the word line WL1. For example, the resistance value may be measured at both ends of the word line WL1 in the extending direction D1.

Then, step S104 is performed to measure the resistance value Rs2 of the word line WL2. For example, the resistance value may be measured at both ends of the word line WL2 in the extending direction D3. In the embodiment, the resistance value Rs2 is, for example, greater than the resistance value Rs1.

Next, step S106 is performed to monitor the height of the fin 100a by the resistance value Rs1 and the resistance value Rs2. The resistance value Rs1 of the word line WL1 is affected both by the distance d1 and by the distance d2, and the resistance value of the word line WL2 is affected only by the distance d2. In this way, the height H of the fin 100a can be monitored by the relativity between the resistance value Rs1 and the resistance value Rs2, whereby the height H of the fin 100a can be effectively and real-timely monitored.

For example, the height of the fin 100a can be monitored by the ratio of the resistance value Rs1 to the resistance value Rs2. The ratio of the resistance value Rs1 to the resistance value Rs2 may be negatively correlated with the height of the fin 100a. That is, the lower the ratio of the resistance value Rs1 to the resistance value Rs2 is, the higher the height of the fin 100a is. In addition, the higher the ratio of the resistance value Rs1 to the resistance value Rs2 is, the lower the height of the fin 100a is.

Furthermore, step S108 may be performed to calculate the height H of the fin 100a. The method of calculating the height of the fin 100a may include the following steps.

As described above, the resistance value of the word line WL1 is set to Rs1; the resistance value of the word line WL2 is set to Rs2; the distance from the top of the word line WL1 to the top of the isolation structures 102 is set to d1; the distance from the top of the word line WL1 to the top of the substrate 100 and the distance from the top of the word line WL2 to the top of the substrate 100 are set to d2; and the height of the fin 100a is set to H.

In the embodiment, for example, the first region R1 has the same structure as the memory cell region, and the word line WL1 and the word line WL2 have the same length L, the same width W, and the same material. Since the word line WL1 and the word line WL2 are made of the same material, the word line WL1 and the word line WL2 may have the same resistivity $\rho$.

The equation of the law of resistance is shown in Equation I. In Equation I, R represents resistance, $\rho$ represents resistivity, L represents length, and A represents cross-sectional area.

$$R = \rho \times \frac{L}{A} \qquad \text{[Equation I]}$$

With the equation of the law of resistance, the following simultaneous equations I-I can be obtained. In Equations I-I, n represents the number of memory cells passed by the word line, Raa1 represents the resistance value of the word line WL1 at the active area AA1, Rsti represents the resistance value of the word line WL1 on the isolation structures 102, and Raa2 represents the resistance value of the word line WL2 on the active area AA2.

$$\begin{cases} Rs1 = n \times Raa1 + n \times Rsti = \\ \quad n \times \rho \times \frac{L}{W \times d2} + n \times \rho \times \frac{L}{W \times d1} \\ Rs2 = n \times 2 \times Raa2 = n \times 2 \times \rho \times \frac{L}{W \times d2} \end{cases} \qquad \text{[Equations I-I]}$$

With the above Equations I-I, the equations of d1 and H can be obtained. d1 can be represented by Equation 1, and H can be represented by Equation 2 below.

$$d1 = \frac{d2}{2\left(\frac{Rs1}{Rs2} - \frac{1}{2}\right)} \qquad \text{[Equation 1]}$$

$$H = d1 - d2 = \left[\frac{1}{2\left(\frac{Rs1}{Rs2} - \frac{1}{2}\right)} - 1\right] \times d2 \qquad \text{[Equation 2]}$$

Next, the distance from the top of the word line WL2 to the top of the substrate 100 can be measured to obtain the value of d2. Since there are no isolation structures 102 in the second region R2, when the distance from the top of the word line WL2 to the top of the substrate 100 is measured, the value of d2 can be accurately obtained In some embodiments, the value of Rs1, the value of Rs2, and the value of d2 may be substituted into Equation 2 to obtain the value of H.

In addition, in some embodiments, the value of Rs1, the value of Rs2, and the value of d2 may be substituted into Equation 1 to obtain the value of d1. Then, the value of d1 and the value of d2 are substituted into Equation 2 to obtain the value of H.

In summary, in the fin height monitoring structure and the fin height monitoring method of the above embodiments, the height of the fin can be monitored by the relativity of the resistance values of the word lines located in different environments, whereby the height of the fin can be effectively and real-timely monitored.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A fin height monitoring structure, comprising:
a substrate comprising a first region and a second region;
a plurality of isolation structures located in the substrate of the first region to define at least one active area, wherein the substrate in the at least one active area has at least one fin higher than the plurality of isolation structures;
a first word line located on the plurality of isolation structures of the first region and on the at least one fin of the first region, wherein a lower surface of the first word line is uneven; and
a second word line located on the substrate of the second region, wherein the second word line is not located on the plurality of isolation structures, an entire lower surface of the entire second word line is flat, and a second resistance value of the second word line is greater than a first resistance value of the first word line.

2. The fin height monitoring structure according to claim 1, wherein the first region and the second region are located on a scribe line of a wafer.

3. The fin height monitoring structure according to claim 1, wherein the plurality of isolation structures are located only in the first region.

4. The fin height monitoring structure according to claim 1, wherein the first word line and the second word line have a same length and a same width.

5. The fin height monitoring structure according to claim 1, wherein an extending direction of the first word line intersects an extending direction of the at least one fin.

6. The fin height monitoring structure according to claim 1, wherein the first word line and the second word line are made of a same material.

7. The fin height monitoring structure according to claim 1, wherein a plurality of trenches are located in the substrate of the first region, and the plurality of isolation structures and a part of the first word line are located in the plurality of trenches.

8. The fin height monitoring structure according to claim 1, wherein the substrate comprises a semiconductor substrate.

9. The fin height monitoring structure according to claim 1, wherein a material of the plurality of isolation structures comprises silicon oxide.

10. The fin height monitoring structure according to claim 1, wherein the first word line comprises a buried word line.

11. The fin height monitoring structure according to claim 1, wherein materials of the first word line and the second word line comprise a metal.

12. A fin height monitoring method, comprising:
providing the fin height monitoring structure according to claim 1;
measuring the first resistance value of the first word line;
measuring the second resistance value of the second word line; and
monitoring a height of the at least one fin by the first resistance value and the second resistance value.

13. The fin height monitoring method according to claim 12, wherein the height of the at least one fin is monitored by a ratio of the first resistance value to the second resistance value.

14. The fin height monitoring method according to claim 13, wherein the ratio of the first resistance value to the second resistance value is negatively correlated with the height of the at least one fin.

15. The fin height monitoring method according to claim 12, further comprising calculating the height of the at least one fin, wherein a method of calculating the height of the at least one fin comprises:
setting the first resistance value to Rs1, setting the second resistance value to Rs2, setting a distance from a top of the first word line to a top of the plurality of isolation structures to d1, and setting a distance from the top of the first word line to a top of the substrate and a distance from a top of the second word line to the top of the substrate to d2, the d1 being represented by Equation 1:

$$d1 = \frac{d2}{2\left(\frac{Rs1}{Rs2} - \frac{1}{2}\right)}. \qquad \text{[Equation 1]}$$

16. The fin height monitoring method according to claim 15, wherein the method of calculating the height of the at least one fin further comprises setting the height of the at least one fin to H, the H being represented by Equation 2:

[Equation 2]

$$H = d1 - d2 = \left[\frac{1}{2\left(\frac{Rs1}{Rs2} - \frac{1}{2}\right)} - 1\right] \times d2. \qquad \text{[Equation 2]}$$

17. The fin height monitoring method according to claim 16, wherein the method of calculating the height of the at least one fin further comprises:
measuring the distance from the top of the second word line to the top of the substrate to obtain a value of the d2; and
substituting a value of the Rs1, a value of the Rs2, and a value of the d2 into the Equation 2 to obtain a value of the H.

18. The fin height monitoring method according to claim 16, wherein the method of calculating the height of the at least one fin further comprises:
measuring the distance from the top of the second word line to the top of the substrate to obtain a value of the d2;
substituting a value of the Rs1, a value of the Rs2, and a value of the d2 into the Equation 1 to obtain a value of the d1; and
substituting the value of the d1 and the value of the d2 into the Equation 2 to obtain a value of the H.

* * * * *